United States Patent
Misaka et al.

(10) Patent No.: US 11,698,581 B2
(45) Date of Patent: Jul. 11, 2023

(54) METHOD AND COMPUTING DEVICE FOR MANUFACTURING SEMICONDUCTOR DEVICE

(71) Applicant: Samsung Electronics Co., Ltd., Suwon-si (KR)

(72) Inventors: Akio Misaka, Hwaseong-si (KR); Changsoo Kim, Hwaseong-si (KR); Noyoung Chung, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 94 days.

(21) Appl. No.: 17/360,365

(22) Filed: Jun. 28, 2021

(65) Prior Publication Data

US 2022/0121107 A1    Apr. 21, 2022

(30) Foreign Application Priority Data

Oct. 19, 2020  (KR) .......................... 10-2020-0134995

(51) Int. Cl.
  *G03F 1/36* (2012.01)
  *G06F 30/392* (2020.01)
  *G06N 20/00* (2019.01)

(52) U.S. Cl.
  CPC .............. *G03F 1/36* (2013.01); *G06F 30/392* (2020.01); *G06N 20/00* (2019.01)

(58) Field of Classification Search
  CPC ........ G03F 1/36; G06F 30/392; G06F 30/398; G06N 20/00; G06N 3/0454; G06N 3/088; G06N 20/10; H01L 27/0207
  See application file for complete search history.

(56) References Cited

U.S. PATENT DOCUMENTS

| 9,626,459 B2 | 4/2017 | Agarwal et al. |
| 10,386,714 B2 * | 8/2019 | Kohli .................. G03F 1/36 |
| 10,521,539 B2 | 12/2019 | Yu et al. |

(Continued)

FOREIGN PATENT DOCUMENTS

| KR | 10-2017-0016549 A | 2/2017 |
| WO | WO-2017/016549 A1 | 2/2017 |

(Continued)

OTHER PUBLICATIONS

Weiwu Yan et al., 'Nonlinear and robust statistical process monitoring based on variant autoencoders' *Chemometrics and Intelligent Laboratory Systems*, vol. 158, 2016, pp. 31-40.

*Primary Examiner* — Stacy Whitmore
(74) *Attorney, Agent, or Firm* — Harness, Dickey & Pierce, P.L.C.

(57) ABSTRACT

A non-transitory computer-readable medium storing codes that, when executed by a processor, cause the processor to perform operations of receiving full chip data including specific patterns of a first layout, extracting a representative pattern of the first layout from the full chip data, generating a vector of the extracted representative pattern, generating a first data set based on the generated vector, generating a machine learning model by performing machine learning with respect to the first data set, executing an optical proximity correction (OPC) with respect to the specific patterns of the first layout by using the machine learning model, and generating a second layout based on a result of executing the OPC may be provided.

19 Claims, 10 Drawing Sheets

(56) References Cited

U.S. PATENT DOCUMENTS

| | | | |
|---|---|---|---|
| 10,546,085 B2 | 1/2020 | Hu et al. | |
| 10,592,635 B2 | 3/2020 | Sha et al. | |
| 10,846,448 B1 * | 11/2020 | Pikus | G06N 10/00 |
| 2008/0077891 A1 * | 3/2008 | Dooling | G06F 30/398 |
| | | | 716/52 |
| 2008/0077907 A1 | 3/2008 | Kulkarni | |
| 2017/0038674 A1 | 2/2017 | Jeong | |
| 2017/0357911 A1 | 12/2017 | Liu et al. | |
| 2019/0147134 A1 * | 5/2019 | Wang | G06F 30/20 |
| | | | 716/52 |
| 2020/0074611 A1 * | 3/2020 | Dou | G06T 7/001 |
| 2020/0090036 A1 * | 3/2020 | Nakata | G06N 3/084 |
| 2021/0334444 A1 * | 10/2021 | Lee | G03F 1/36 |
| 2021/0357566 A1 * | 11/2021 | Simmons | G06N 3/0454 |
| 2022/0155695 A1 * | 5/2022 | Moon | G03F 7/70508 |

FOREIGN PATENT DOCUMENTS

| | | | | |
|---|---|---|---|---|
| WO | WO-2017/0171890 A1 | 10/2017 | | |
| WO | WO-2017/171891 A1 | 10/2017 | | |
| WO | WO-2019162346 A1 * | 8/2019 | | G03F 1/36 |
| WO | WO-2020120050 A1 * | 6/2020 | | G03F 7/705 |
| WO | WO-2021052712 A1 * | 3/2021 | | G03F 1/36 |
| WO | WO-2022010467 A1 * | 1/2022 | | |
| WO | WO-2022010469 A1 * | 1/2022 | | |

\* cited by examiner

METHOD AND COMPUTING DEVICE FOR MANUFACTURING SEMICONDUCTOR DEVICE

CROSS-REFERENCE TO RELATED APPLICATIONS

This application claims priority under 35 U.S.C. § 119 to Korean Patent Application No. 10-2020-0134995 filed on Oct. 19, 2020, in the Korean Intellectual Property Office, the disclosures of which are incorporated by reference herein in their entireties.

BACKGROUND

Example embodiments of the present disclosure described herein relate to semiconductor devices, and more particularly, relate to methods and/or computing devices that generate a layout of manufacturing a semiconductor device with improved accuracy using machine learning.

A semiconductor process that manufactures semiconductor devices is implemented by a combination of various procedures such as etching, deposition, planation, growth, implanting, etc. The etching may be performed by forming a pattern of a photoresist on an object, and then by removing portions of the object that are not covered with the photoresist using chemicals, gases, plasmas, ion beams, etc.

In a process of performing the etching, process errors may occur due to various factors. Factors that cause the process errors may come from characteristics of the process, and further may come from characteristics of the pattern of the photoresist or characteristics of a semiconductor pattern implemented by the etching. The process errors due to the characteristics of patterns may be compensated for by modifying or changing a layout of the patterns.

However, in technologies of securing a layout by conventional machine learning, it is difficult to secure data for a myriad of unique patterns (interchangeably referred to as specific patterns) of semiconductor devices/elements. Due to such difficulty, it is difficult to secure pattern coverage with respect to the unique patterns of semiconductor devices/elements.

SUMMARY

Example embodiments of the present disclosure provide methods and/or computing devices that generate a layout of manufacturing a semiconductor device. The methods and/or computing devices construct a data set with respect to unique patterns of semiconductor devices/elements using machine learning, and have improved reliability and reduced computational load.

According to an example embodiment of the present disclosure, a non-transitory computer-readable medium storing codes that, when executed by a processor, cause the processor to perform operations of receiving full chip data including specific patterns of a first layout, extracting a representative pattern of the first layout from the full chip data, generating a vector of the extracted representative pattern, generating a first data set based on the generated vector, generating a machine learning model by performing machine learning with respect to the first data set, executing an optical proximity correction (OPC) with respect to the specific patterns of the first layout by using the machine learning model, and generating a second layout based on a result of the OPC.

According to an example embodiment, the generating a machine learning model may include performing a quantitative analysis on a difference between the specific patterns of the first layout and the specific patterns of the second layout, generating a statistical data set based on a result of the quantitative analysis, and generating first statistical data based on statistical first data set and the specific patterns of the second layout.

According to an example embodiment, the generating a machine learning model may include extracting the specific patterns of the first layout by a pattern-based optical proximity correction accelerator included in the processor.

According to an example embodiment, the generating a second layout may include determining an arrangement error rate of the first layout based on a preset first criterion, and performing the OPC with respect to the specific patterns of the first layout based on a result of the determining an arrangement error rate.

According to an example embodiment, the generating a second layout may include determining an upper management limit and a lower management limit of first statistical data based on a second criterion, the first statistical data generated during the generating a machine learning model, and performing the OPC with respect to the specific patterns of the first layout based on a result of the determining an upper management limit and a lower management limit.

According to an example embodiment, the first criterion may be a criterion for determining whether the arrangement error rate of the first layout is 10% or more, and the generating a second layout may include extracting the specific patterns of the first layout when the arrangement error rate of the first layout is 10% or more.

According to an example embodiment, the second criterion may be a criterion for setting the upper management limit and the lower management limit of the first statistical data to 95%, and the generating a second layout may include extracting the specific patterns of the first layout at a point where the upper management limit and the lower management limit of a distribution of the first statistical data are 95% or more.

According to an example embodiment, the generating a machine learning model may include adding the specific patterns of the first layout that are extracted at a point where an arrangement error rate of the first layout is 10% or more and an upper management limit and a lower management limit of a distribution of the first statistical data are 95% or more, to the first data set.

According to an example embodiment, the codes, when executed by the processor, may cause the processor to further perform an operation of manufacturing a mask based on the second layout.

According to an example embodiment, the codes, when executed by the processor, may cause the processor to further perform operations of include iterating the generating a machine learning model and the generating a second layout, and adding specific patterns extracted from the second layout in the data set.

According to an example embodiment of the present disclosure, a method of manufacturing a semiconductor device includes receiving, by at least one processor, full chip data including specific patterns of a first layout, extracting, by at least one processor, a representative pattern of the first layout from the full chip data, generating, by at least one processor, a vector of the extracted representative pattern, generating, by at least one processor, a first data set based on the generated vector, generating, by at least one processor, a machine learning model by performing machine learning with respect to the first data set, executing, by at least one processor, an optical proximity correction (OPC) with respect to the specific patterns of the first layout by using the machine learning model, and generating, by at least one processor, a second layout based on a result of executing the OPC.

According to an example embodiment, the generating a machine learning model may include performing a quantitative analysis on a difference between the specific patterns of the first layout and the specific patterns of the second layout, generating a statistical data set based on a result of the quantitative analysis, and generating first statistical data based on the statistical data set and the specific patterns of the second layout.

According to an example embodiment, the generating a machine learning model may include extracting the specific patterns of the first layout by a pattern-based OPC accelerator included in the at least one processor.

According to an example embodiment, the generating a second layout may include determining an arrangement error rate of the first layout based on a first criterion, and performing the OPC with respect to the specific patterns of the first layout based on a result of the determining an arrangement error rate.

According to an example embodiment, the generating a second layout may include determining an upper management limit and a lower management limit of first statistical data based on a second criterion, the first statistical data generated during the generating a machine learning model, and performing the OPC with respect to the specific patterns of the first layout based on a result of the determining an upper management limit and a lower management limit.

According to an example embodiment, the first criterion may be a criterion for determining whether the arrangement error rate of the first layout is 10% or more, and the generating a second layout may include extracting the specific patterns of the first layout when the arrangement error rate of the first layout is 10% or more.

According to an example embodiment, the second criterion may be a criterion for setting the upper management limit and the lower management limit of the first statistical data to 95%, and the generating a second layout may include extracting the specific patterns of the first layout at a point where the upper management limit and the lower management limit of a distribution of the first statistical data are 95% or more.

According to an example embodiment, the generating a machine learning model may include adding the specific patterns of the first layout that are extracted at a point where an arrangement error rate of the first layout is 10% or more and an upper management limit and a lower management limit of a distribution of the first statistical data are 95% or more, to the first data set.

According to an example embodiment, the method of manufacturing a semiconductor device may further include iterating the generating a machine learning model and the generating a second layout, and adding specific patterns extracted from the second layout in the first data set.

According to an example embodiment of the present disclosure, a mask for manufacturing a semiconductor device may include at least one processor configured to receive full chip data including specific patterns of a first layout, extract a representative pattern of the first layout from the full chip data, generate a vector of the extracted representative pattern, generate a first data set based on the generated vector, generate a machine learning model by performing machine learning with respect to the first data set, execute an optical proximity correction (OPC) with respect to the specific patterns using the machine learning model, and generate a second layout based on a result of executing the OPC.

BRIEF DESCRIPTION OF THE FIGURES

The above and other objects and features of the present disclosure will become apparent by describing in detail some example embodiments thereof with reference to the accompanying drawings.

DETAILED DESCRIPTION

Figure 1:
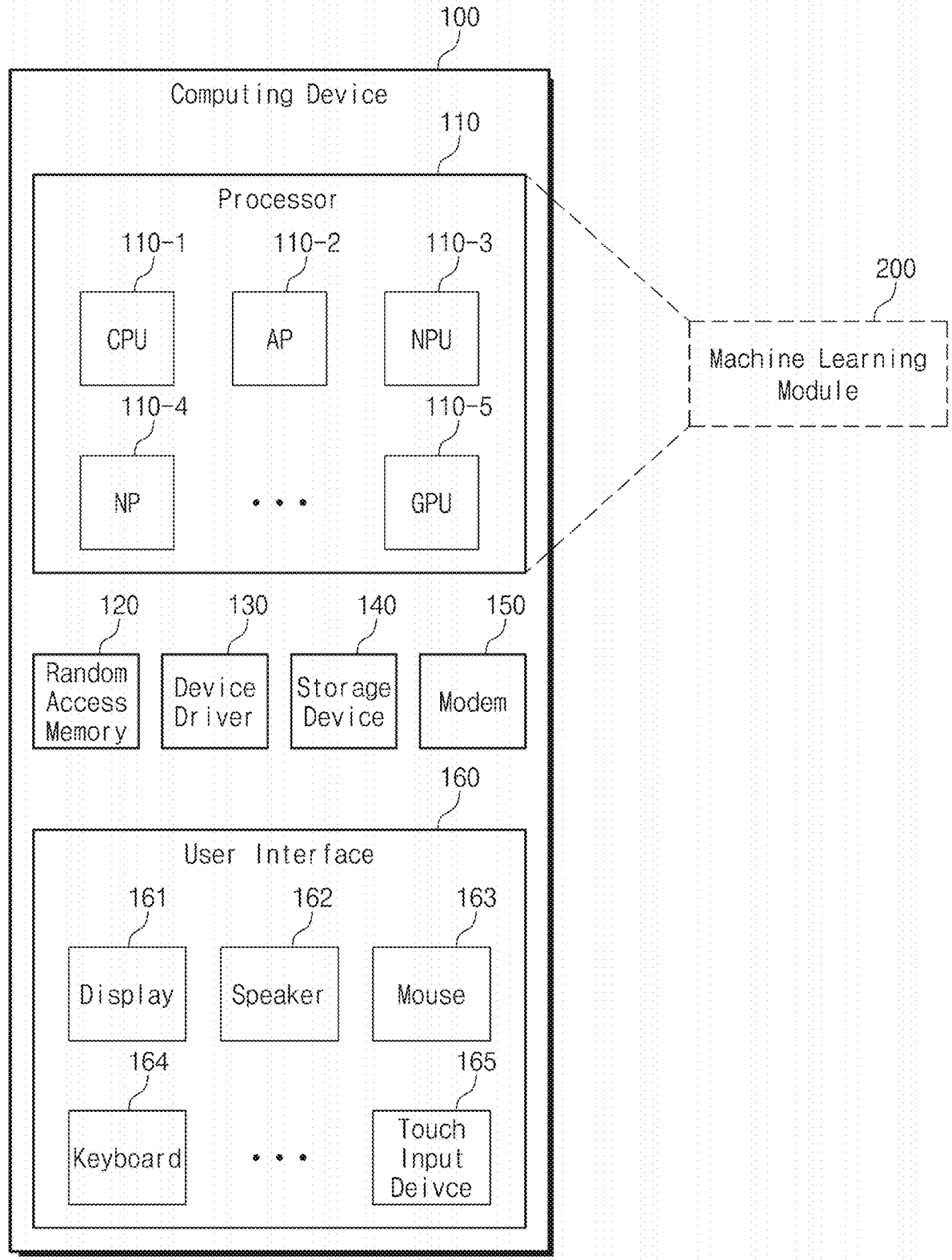
FIG. 1 is a block diagram illustrating a computing device according to an example embodiment of the present disclosure.

Throughout the specification, the same reference numerals refer to the same components. This specification does not describe all elements of the example embodiments, and duplicated descriptions as to well-known contents in the technical field to which the present disclosure pertains are omitted. The term "unit, module, member, or block" used in the specification may be implemented by software or hardware or a combination of hardware and software, and according to example embodiments. It is also possible that a plurality of "units, modules, members, or blocks" may be implemented as one component, or that one "part, module, member, or block" includes a plurality of components.

Throughout the specification, when a part is "connected" to another part, this includes a case of being indirectly connected as well as being connected directly, and indirect connection includes connecting through a wireless communication network.

Also, when a part is said to "comprise" a certain component, this means that other components may be further included instead of excluding other components unless specifically stated otherwise.

Terms such as first and second are used to distinguish one component from other components, and the component is not limited by the above-described terms.

A singular expression includes a plural expression unless the context clearly indicates otherwise.

In each of operations, reference numerals are used for convenience of description, and the reference numerals do not describe the order of each of operations, and each of operations may be performed differently from the specified order, unless a specific order is explicitly stated in the context.

Hereinafter, some example embodiments of the present disclosure will be described with reference to accompanying drawings.

FIG. 1 is a block diagram illustrating a computing device 100 according to an example embodiment of the present disclosure.

Referring to FIG. 1, the computing device 100 may include a processor 110, a random access memory 120, a device driver 130, a storage device 140, a modem 150, and a user interface 160. In this case, the computing device 100 may include a non-transitory computer-readable medium storing codes, and may include the processor 110 configured to execute the codes stored in the non-transitory computer-readable medium.

The processor 110 (or at least one element of the processor 110) may execute a machine learning module 200 in relation to a semiconductor process. The machine learning module 200 related to the semiconductor process may generate a layout for manufacturing a semiconductor device, based on machine learning. For example, the machine learning module 200 may be implemented in the form of instructions (or codes) executed by the processor 110 (e.g., at least one of elements constituting the processor 110). In this case, the processor 110 may load instructions (or codes) of the machine learning module 200 into the random access memory 120.

As another example, the processor 110 may be manufactured to implement the machine learning module 200. As still another example, the processor 110 may be manufactured to implement various machine learning modules. The processor 110 may implement the machine learning module 200 by receiving information corresponding to the machine learning module 200.

The machine learning may utilize a variety of other artificial neural network organizational and processing models, such as deconvolutional neural networks, recurrent neural networks (RNN) including long short-term memory (LSTM) units and/or gated recurrent units (GRU), stacked neural networks (SNN), state-space dynamic neural networks (SSDNN), deep belief networks (DBN), generative adversarial networks (GANs), and/or restricted Boltzmann machines (RBM).

Alternatively or additionally, such network structures may include other forms of machine learning models, such as, for example, linear and/or logistic regression, statistical clustering, Bayesian classification, decision trees, dimensionality reduction such as principal component analysis, and expert systems; and/or combinations thereof, including ensembles such as random forests.

The processor 110 may include at least one general-purpose processor such as a central processing unit 110-1 (CPU), an application processor (AP), etc. The processor 110 may also include at least one special purpose processor such as a neural processing unit 110-3, a neuromorphic processor 110-4, a graphics processing unit 110-5 (GPU), etc. The processor 110 may include two or more processors of the same type.

The random access memory 120 may be used as an operating memory of the processor 110 and may be used as a main memory or a system memory of the computing device 100. The random access memory 120 may include a volatile memory such as a dynamic random access memory or a static random access memory, or a nonvolatile memory such as a phase change random access memory, a ferroelectric random access memory, a magnetic random access memory, or a resistive random access memory.

The device driver 130 may control peripheral devices such as the storage device 140, the modem 150, and the user interface 160 in response to a request of the processor 110. The storage device 140 may include a fixed storage device such as a hard disk drive or a solid state drive, or a removable storage device such as an external hard disk drive, an external solid state drive, or a removable memory card.

The modem 150 may provide remote communication with an external device. The modem 150 may perform wireless or wired communication with the external device. The modem 150 may communicate with the external device through at least one of various communication types such as Ethernet, Wi-Fi, LTE, or 5G mobile communication.

The user interfaces 160 may receive information from a user and may provide information to the user. The user interfaces 160 may include at least one user output interface such as a display 161, a speaker 162, etc., and at least one user input interface such as a mouse 163, a keyboard 164, a touch input device 165, etc.

Instructions (or codes) of the machine learning module 200 may be received through the modem 150 and may be stored in the storage device 140. Instructions (or codes) of the machine learning module 200 may be stored in the removable storage device and may be coupled to the computing device 100. Instructions (or codes) of the machine learning module 200 of the semiconductor process may be loaded from the storage device 140 into the random access memory 120 and may be executed.

Figure 2:
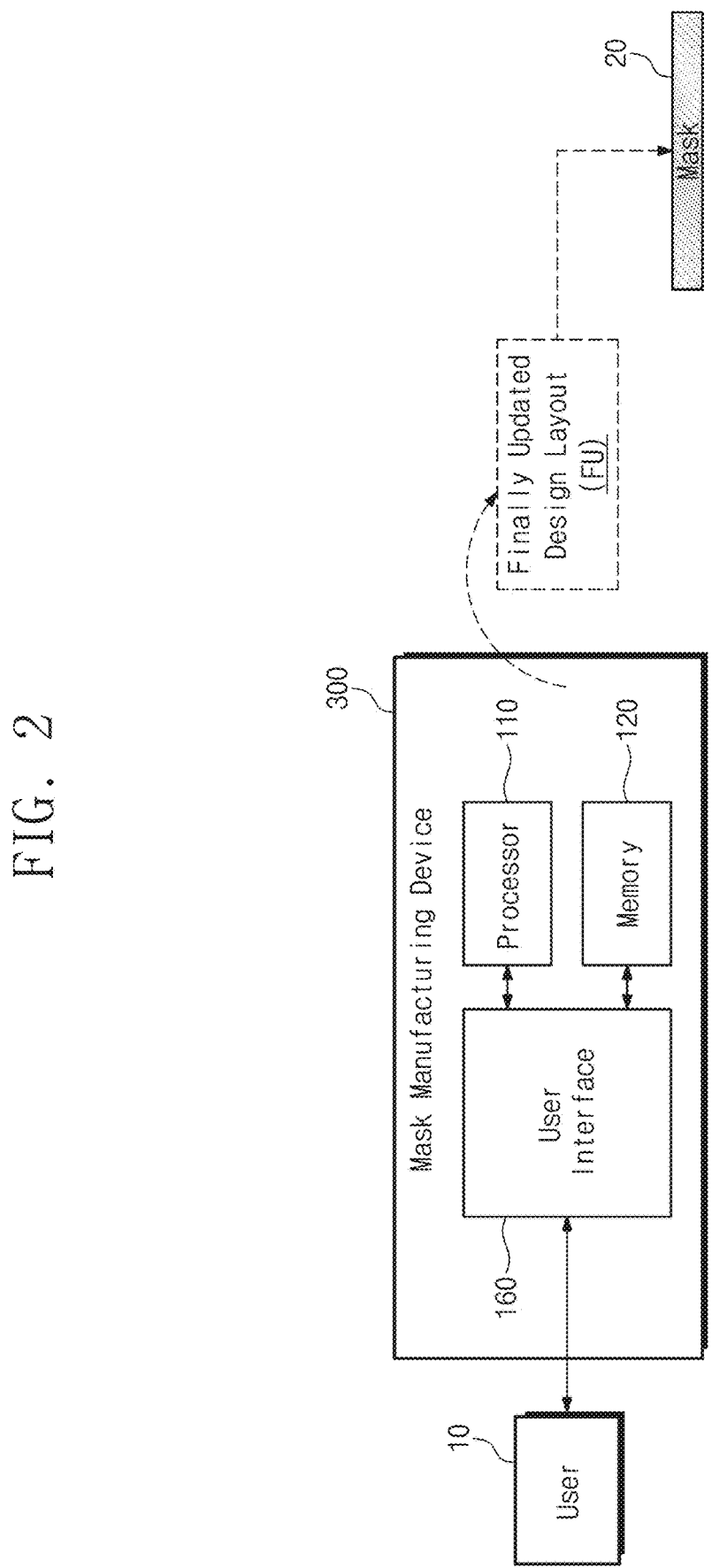
FIG. 2 is a conceptual diagram illustrating how a computing device according to an example embodiment of the present disclosure is utilized in a mask manufacturing device.

FIG. 2 is a conceptual diagram illustrating how the computing device 100 according to an example embodiment of the present disclosure is utilized in a mask manufacturing device 300.

Referring to FIG. 2, the mask manufacturing device 300 may include the processor 110, the memory 120, and the user interface 160, which are components of the computing device 100. The mask manufacturing device 300 may be used to perform an optical proximity correction according to some example embodiments of the present disclosure to be described later and to manufacture a mask 20.

The processor 110 may include at least one of a general-purpose processor or a dedicated processor such as a workstation processor. The processor 110 may perform various arithmetic operations and/or logic operations for mask manufacturing. To this end, the processor 110 may include one or more processor cores. For example, the processor core of the processor 110 may include a special-purposed logic circuit (e.g., a Field Programmable Gate Array (FPGA), an Application Specific Integrated Chips (ASICs), etc.).

The memory 120 may temporarily or semi-permanently store data processed or to be processed by the processor 110. To this end, the memory 120 may include at least one of a volatile memory such as a dynamic random access memory (DRAM), a static RAM (SRAM), a synchronous DRAM (SDRAM), etc., and/or a nonvolatile memory such as a flash memory, a phase-change RAM (PRAM), a magneto-resistive RAM (MRAM), a resistive RAM (ReRAM), a ferroelectric RAM (FRAM), etc.

Depending on the operation of the processor 110 and the memory 120, some example embodiments to be described later may be implemented. For example, depending on the operation of the processor 110 and the memory 120, the optical proximity correction may be performed on segments obtained by dividing a design layout, and a bias value corresponding to each of the segments may be calculated. Furthermore, the characteristics of the segment may be defined. Accordingly, the mask manufacturing device 300 may be used to manufacture the mask 20 depending on the operation of the processor 110 and the memory 120.

The mask manufacturing device 300 may execute software depending on the operation of the processor 110 and the memory 120. As an example, the software may include an operating system and/or one or more application programs. The operating system may provide one or more services to the application program, and may operate as an intermediary between the application program and the components of the mask manufacturing device 300. Further, the operating system may include a design program used to design a layout and to perform the optical proximity correction according to some example embodiments of the present disclosure.

The user interface 160 may operate to provide a result obtained by the operation of the processor 110 and the memory 120 to a user 10. Furthermore, the user interface 160 may be used to receive various data (e.g., data related to design layout) from the user 10. As an example, the user 10 may be a designer of the mask 20 and the layout. For example, the user interface 160 may include an input/output interface such as a display device, a speaker, a keyboard, a mouse, a touch input device, etc.

The mask manufacturing device 300 may output a finally updated design layout FU, as described later. The mask manufacturing device 300 may manufacture the mask 20, based on the finally updated design layout FU. The mask 20 may be manufactured including image patterns corresponding to the finally updated design layout FU. The mask 20 may be used to lithograph circuit patterns on a wafer WF in a photolithography system.

According to an example embodiment of the present disclosure, the optical proximity correction performed by the mask manufacturing device 300 may be completed in a relatively short time. Therefore, the speed and efficiency of the optical proximity correction may be improved.

Figure 3:
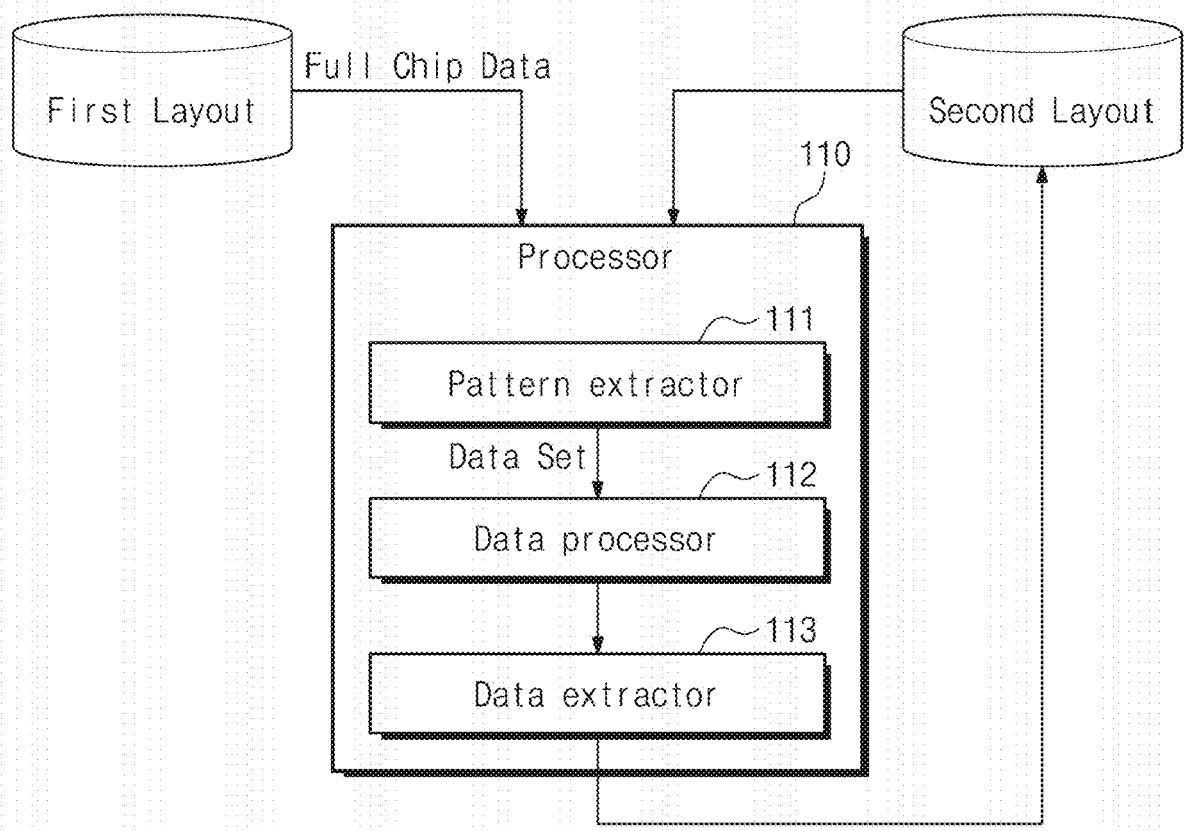
FIG. 3 is a block diagram illustrating a configuration of a processor of a computing device according to an example embodiment of the present disclosure.

FIG. 3 is a block diagram illustrating a configuration of the processor 110 of the computing device 100 according to an example embodiment of the present disclosure.

Referring to FIG. 3, the computing device 100 includes the processor 110 that receives a first layout and a second layout and outputs the second layout. In addition, the processor 110 includes a pattern extractor 111 that extracts patterns of a semiconductor, a data processor 112 that processes data associated with the extracted patterns, and a data extractor 113 that extracts the processed data.

The pattern extractor 111 receives full chip data including unique patterns (interchangeably referred to as specific patterns) of the first layout. In this case, the full chip data received by the pattern extractor 111 may be used as input data in machine learning for generating the second layout, and a machine learning model may be generated based on the full chip data. Further, as described later, the pattern extractor 111 may compare the unique pattern of the semiconductor extracted from the second layout with the unique pattern of the first layout, and may augment data on the layouts depending on a desired (or alternatively, preset) criterion.

The data processor 112 receives a data set associated with the unique pattern of the first layout from the full chip data received by the pattern extractor 111, and extracts a representative pattern of the semiconductor, based on the unique patterns of the semiconductor included in the data set. In this case, for convenience of description, data associated with the unique pattern of the first layout are defined as a first data set. Further, the representative pattern of the semiconductor may be a pattern most distributed in the first data set, but is not limited thereto. Further, the data processor 112 generates a vector of the representative pattern from the extracted first data set, and generates the machine learning model based on the extracted representative pattern vector. The machine learning model may include the representative pattern of the unique patterns of the semiconductor included in the first data set.

In this case, the data processor 112 may include a pattern-based optical proximity correction accelerator (not illustrated), and may extract the unique pattern of the semiconductor by the pattern-based optical proximity correction accelerator, and may generate the machine learning model by using the extracted unique pattern of the semiconductor. For example, the data processor 112 may generate the machine learning model using a k-means clustering algorithm. Operations of the data processor 112 will be described in detail with reference to FIGS. 4 and 5.

Further, the data processor 112 performs machine learning with respect to the first data set. For example, the data processor 112 may perform a quantitative analysis with respect to a difference between the unique patterns of the first layout and the second layout, may make statistically the new first data set based on a result of the quantitative analysis, and may generate first statistical data based on the statistically made new first data set with the unique pattern of the second layout (e.g., by comparing the statistically made new first data set with the unique pattern of the second layout). After the quantitative analysis with respect to the unique pattern of the first layout is performed, data generated through comparison with the unique pattern of the second layout may be defined as the first statistical data. For example, the first statistical data are quantitative data, and the first statistical data may be information associated with a difference between the unique pattern of the first layout and the unique pattern of the second layout, but is not limited thereto.

The data extractor 113 may perform the optical proximity correction (OPC) with respect to the unique patterns of the semiconductor, based on the first statistical data. Further, the data extractor 113 may generate the second layout based on a result of performing machine learning on a semiconductor pattern.

The data extractor 113 may determine an arrangement error rate of the first layout, based on a desired (or alternatively, preset) first criterion, and may perform the optical proximity correction with respect to the first layout, based on a result of the determination. For example, the first criterion relates to the arrangement error rate of the first layout. For example, the first criterion according to the present disclosure may be a criterion for determining whether the arrangement error rate of the first layout is 10% or more. When the first criterion according to an example embodiment of the present disclosure is a criterion for determining whether the arrangement error rate of the first layout is 10% or more, the data processor 112 may extract the unique pattern of the semiconductor and may determine the extracted unique pattern as data to be the basis for generation of the second layout, when the arrangement error rate of the first layout is 10% or more.

The data extractor 113 may determine an upper management limit and a lower management limit of the first statistical data, based on a desired (or alternatively, preset) second criterion, and may perform the optical proximity correction with respect to the first layout, based on a result of the determination. For example, the second criterion relates to the upper management limit and the lower management limit of the first statistical data. For example, the second criterion according to an example embodiment of the present disclosure may be set to the case where the upper management limit and the lower management limit of the first statistical data are 95%. When the second criterion according to an example embodiment of the present disclosure is set to the case where the upper management limit and the lower management limit of the first statistical data are 95%, the data extractor 113 may extract the unique pattern of the semiconductor at a point where the upper management limit and the lower management limit of a distribution of the first statistical data are 95% or more, and may determine the extracted unique pattern as data to be the basis for generation of the second layout. In other words, the data extractor 113 may add the extracted unique pattern of the semiconductor in the data to be the basis for generation of the second layout.

The processor 110 according to some example embodiments of the present disclosure may continuously form the data set associated with the semiconductor pattern by iterating the operations of the pattern extractor 111, the data processor 112, and the data extractor 113 described above, and by iteratively performing the machine learning process associated with the semiconductor pattern. For example, the processor 110 may repeat generating the first layout and generating the second layout. Further, the processor 110 may include or add the unique pattern of the semiconductor extracted from the second layout in the data set to be the basis for generation of the first layout.

Figure 4:
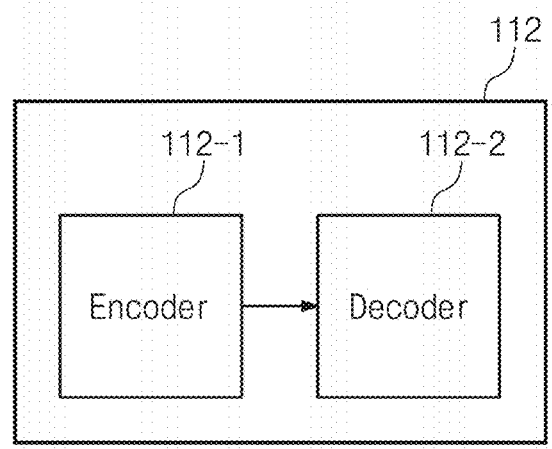
FIG. 4 is a block diagram illustrating a data processor in a computing device according to an example embodiment of the present disclosure.
Figure 5:
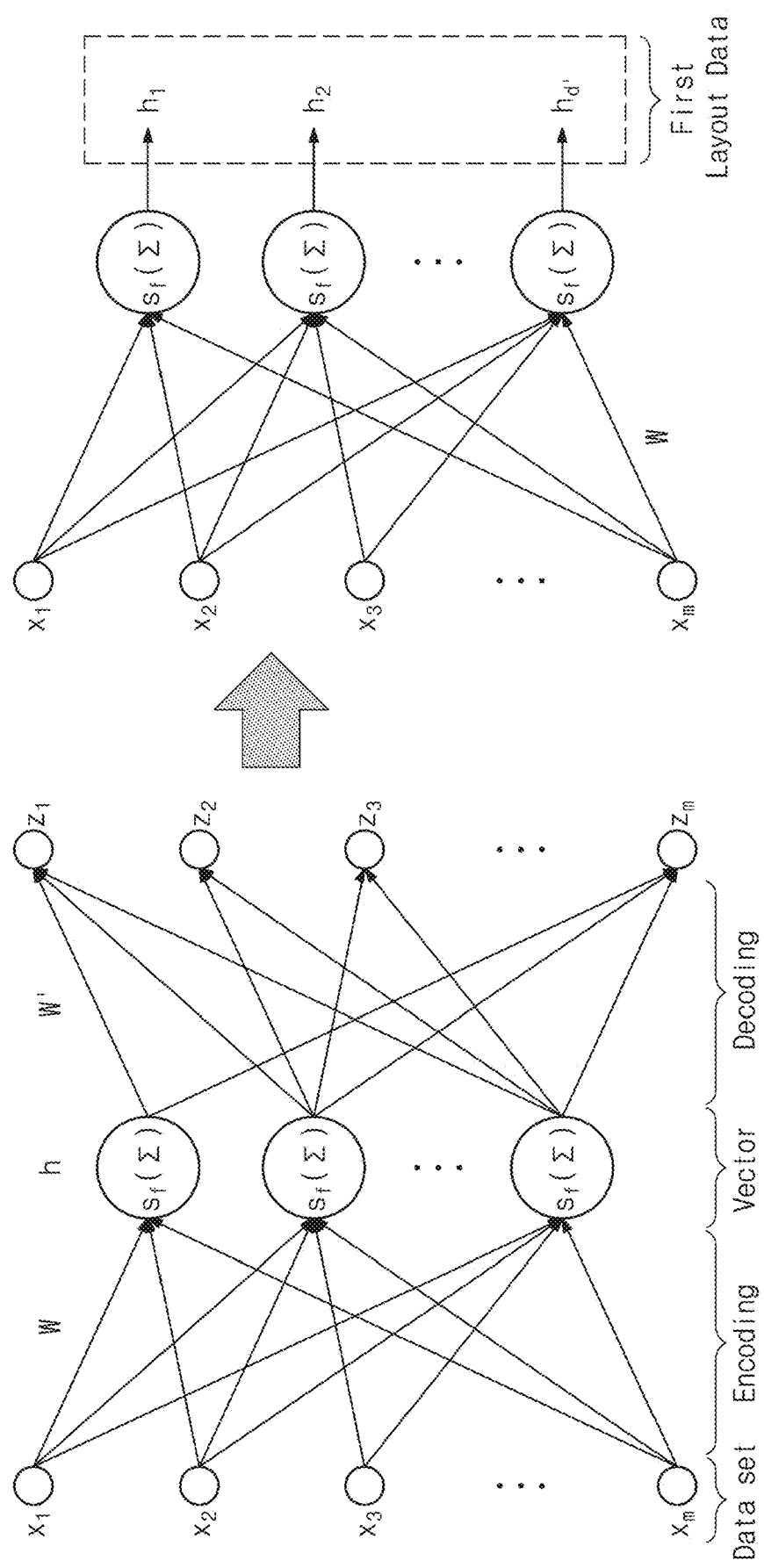
FIG. 5 is a diagram describing an operation of an encoder and a decoder according to an example embodiment of the present disclosure.

FIG. 4 is a block diagram illustrating the data processor 112 in the computing device 100 according to an example embodiment of the present disclosure, and FIG. 5 is a diagram describing an operation of an encoder 112-1 and a decoder 112-2 according to an example embodiment of the present disclosure.

Referring to FIGS. 4 and 5, the data processor 112 according to an example embodiment of the present disclosure may include the encoder 112-1 and the decoder 112-2, may perform encoding with respect to the data set, and may generate the first data set.

The pattern extractor 111, the data processor 112, and the data extractor 113, and the data processor 112 including the encoder 112-1 and the decoder 112-2 may be functional units of the processor 110. The processor 110 is not intended to be limited to such functional units. In some example embodiments, additional functional units may be included in the processor 110. Further, the processor 110 may perform the operations and/or functions of the various functional units without sub-dividing the operations and/or functions of the various functional units into respective functional units.

The processor 110 and/or any portions thereof may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device, for example a solid state drive (SSD), or the like, storing a program of instructions, and a processor configured to execute the program of instructions to implement the functionality of and/or methods performed by some or all of the processor 110 and/or any portions thereof.

The encoder 112-1 receives the data set associated with the unique pattern of the first layout and generates the vector associated with the unique pattern of the semiconductor. For example, the encoder 112-1 may generate the vector using the k-means clustering algorithm. When the vector associated with the unique pattern of the semiconductor is generated using the k-means clustering algorithm, basic data of the first data set may be generated in a manner that reduce or minimizes variance between data. Further, the encoder 112-1 may perform auto-encoder training. When auto-encoder training is performed, the encoder 112-1 may extract data associated with the unique pattern of the semiconductor from which noise is removed.

The decoder 112-2 may convert the vector associated with the unique pattern of the semiconductor extracted from the encoder 112-1, and may generate the first data set. The decoder 112-2 may generate the first data set with a weight W with respect to the unique pattern of the semiconductor. For example, the weight may be set by a user definition.

Figure 6:
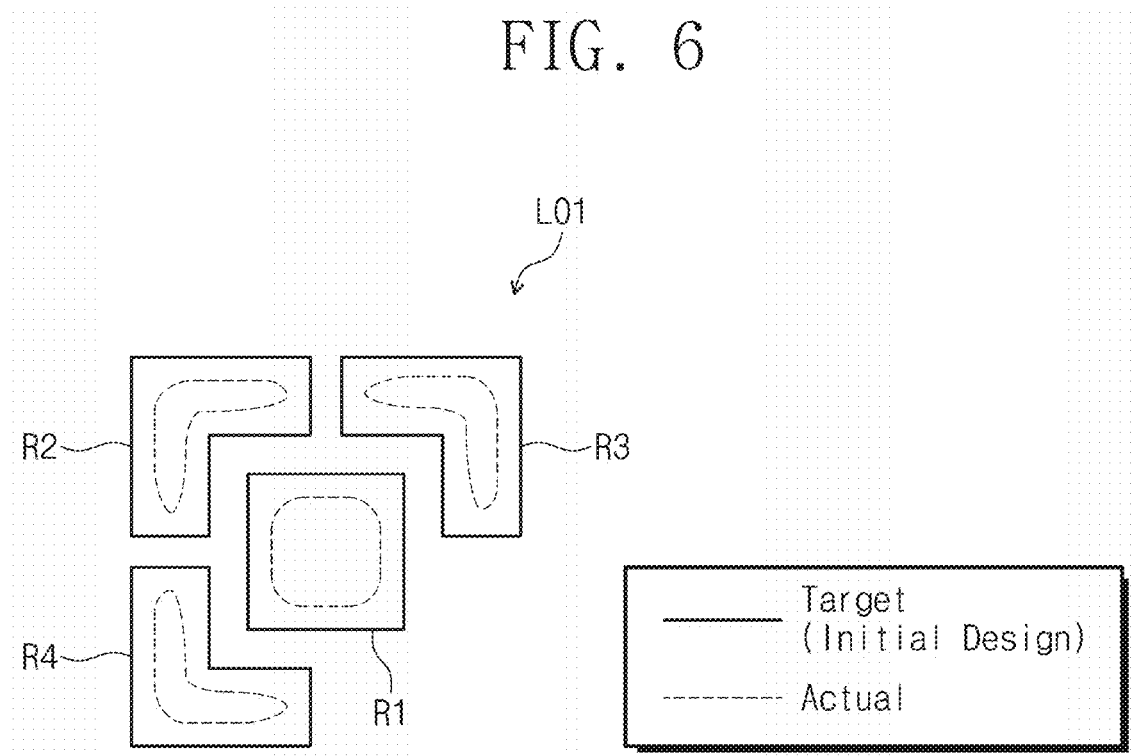
FIG. 6 is a conceptual diagram illustrating a layout on a wafer.

FIG. 6 is a conceptual diagram illustrating a layout on a wafer.

The semiconductor device according to an example embodiment of the present disclosure may include a wafer WF (not illustrated), and a solid line in FIG. 6 represents a target layout to be lithographed on the wafer WF and a dotted line in FIG. 6 represents a layout that may be actually lithographed on the wafer WF.

For example, a layout LO1 may include a first circuit pattern R1 to a fourth circuit pattern R4. However, the shape of the layout LO1 illustrated in FIG. 6 is an example to aid understanding of an example embodiment of the present disclosure, and is not intended to limit the disclosed example embodiment of the present disclosure. Further, the first to fourth circuit patterns R1 to R4 are used to distinguish circuit patterns for convenience, and do not refer to a circuit corresponding to a specific function.

When the computing device 100 according to an example embodiment of the present disclosure is used for manufacturing the wafer WF, a designer of the layout LO1 may intend to lithograph the layout LO1 of the first circuit pattern R1 to the fourth circuit pattern R4 along the solid line of FIG. 6 on the wafer WF. The solid line in FIG. 6 represents a layout to be lithographed as the target layout. The target layout may be provided as an initial design layout.

To mitigate or prevent distortion of the layout, the computing device 100 according to some example embodiments of the present disclosure may perform the optical proximity correction. In the optical proximity correction, to reduce an error between the target layout and the actual layout to be actually lithographed based on the design layout, the design layout may be biased. When the image patterns corresponding to the biased design layout are included in the mask by predicting the distortion caused by interference and diffraction, the actual layout identical to or substantially similar to (e.g., with little or no error) the target layout may be lithographed on the wafer WF.

Figure 7:
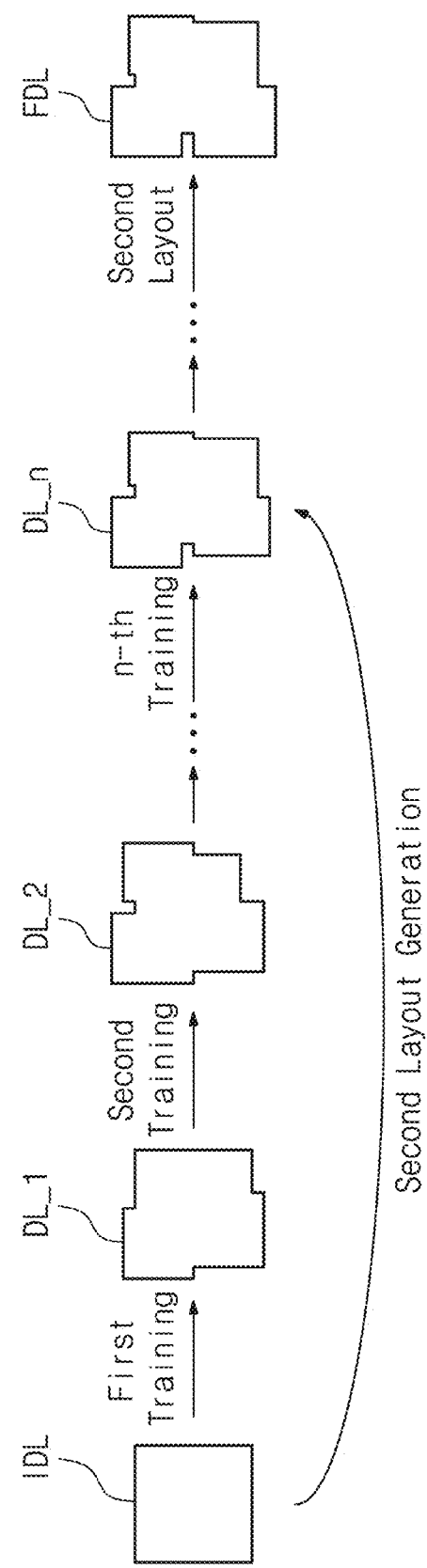
FIG. 7 is a diagram illustrating a process of repeatedly performing machine learning according to an example embodiment the present disclosure.

FIG. 7 illustrates a process of repeatedly performing machine learning according to an example embodiment of the present disclosure.

FIG. 7 describes an example embodiment in which the semiconductor device is the wafer WF. The target layout to be lithographed on the wafer may be provided to the computing device 100 as an initial design layout IDL. As the optical proximity correction is performed on the initial design layout IDL, iterative training is performed on segments obtained by dividing the design layout, and the design layout may be updated. For example, the initial design layout IDL may be updated to a first design layout DL_1 through a first training, and the first design layout DL_1 may be updated to a second design layout DL_2 through a second training. After several times of training (n-th training) are performed, a finally updated design layout FDL may be obtained. The finally updated design layout FDL may correspond to the image patterns to be included in the mask to lithograph the target layout on the wafer, and the final layout may be defined as the second layout.

According to the example embodiment of the present disclosure, the processor 110 generates statistical data with respect to the unique patterns of the semiconductor while performing the above-described first training to n-th training, and performs the optical proximity correction based on the generated statistical data. Thus, the speed and efficiency of the optical proximity correction may be improved.

Figure 8A:
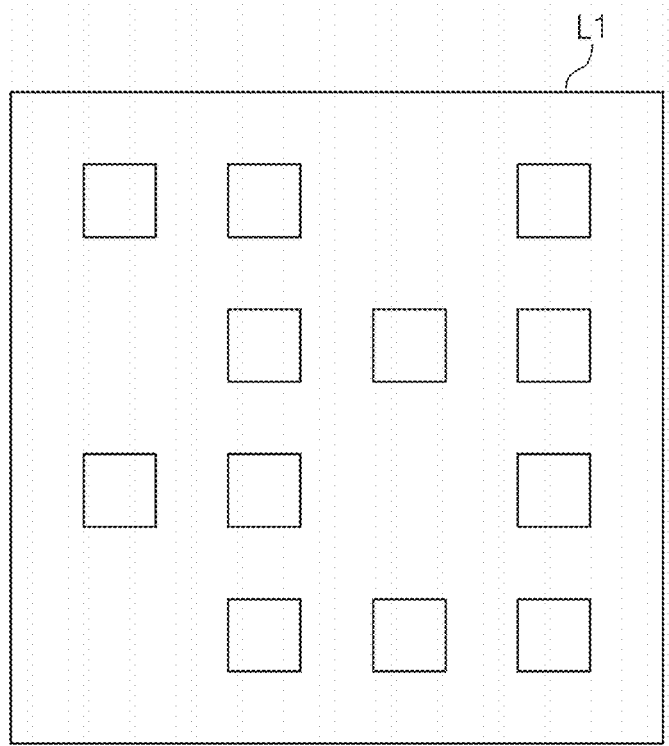
FIG. 8A is a block diagram illustrating an example of a first layout.
Figure 8B:
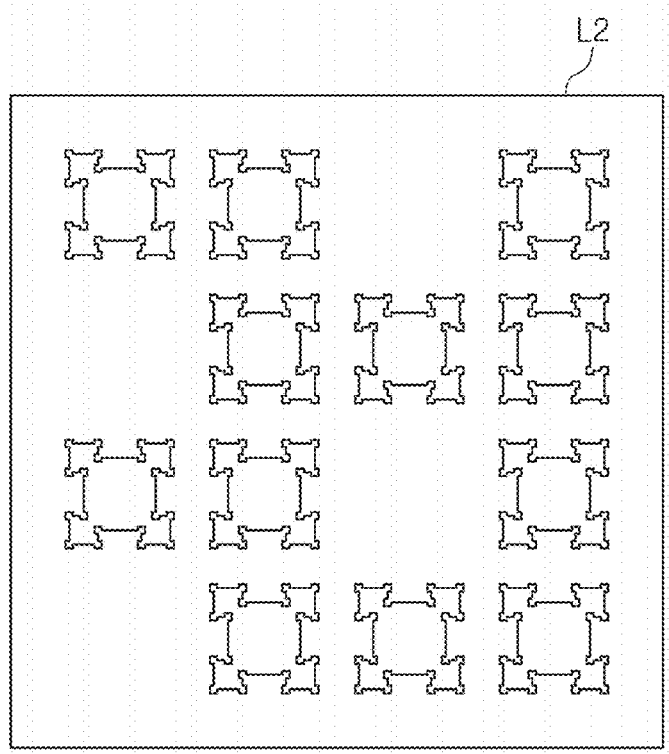
FIG. 8B is a block diagram illustrating an example of a second layout.

FIG. 8A illustrates an example of a first layout, and FIG. 8B illustrates an example of a second layout.

Referring to FIGS. 8A and 8B, a first layout L1 may include rectangular patterns. For example, the rectangular patterns may be patterns of vias. Thus, the first layout L1 may be a layout for generating the vias. The first layout L1 may be a target layout intended to be acquired during after cleaning inspection (ACI).

FIG. 8B illustrates an example of a second layout L2. The patterns of the second layout L2 may have shapes modified from the patterns of the first layout L1 of FIG. 8A. The second layout L2 may be a layout of a photo mask.

Referring to FIG. 8B, the patterns in FIG. 8A each are illustrated to be modified in the same shape. However, this example is only intended to easily convey the technical concepts of an example embodiment of the present disclosure. The patterns of FIG. 8A may be modified into different shapes.

A process of generating the second layout L2 of FIG. 8B from the first layout L1 of FIG. 8A may be performed through a statistics-based process management. For example, the statistics-based process management may be performed using statistical data associated with the unique patterns of the semiconductor. The statistics-based process management may obtain statistical information on outlines (e.g., width and space) of patterns. The machine learning module 200 related to the semiconductor process according to an example embodiment of the present disclosure may perform machine learning-based inference based on statistical data of patterns of the layout, thereby performing (e.g., resulting in) improved accuracy and reduced computation.

Figure 9A:
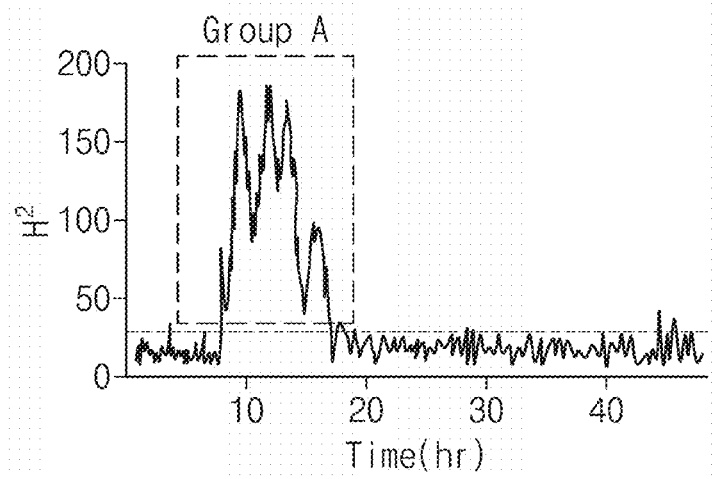
FIGS. 9A and 9B are diagrams illustrating a concept of generating a second layout using a method of manufacturing a semiconductor device according to an example embodiment the present disclosure.
Figure 9B:
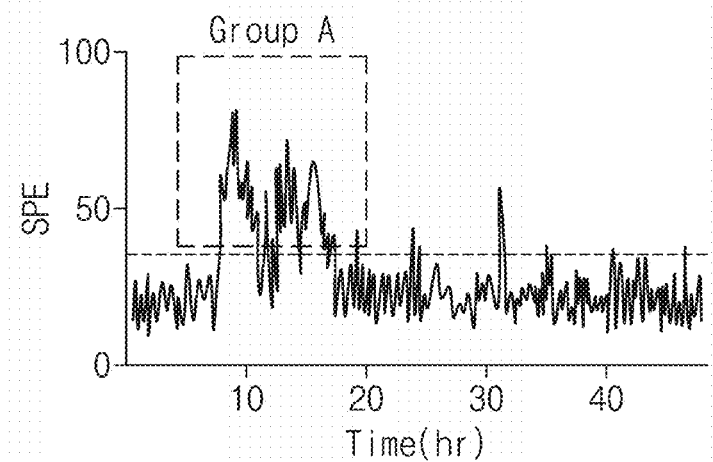

FIGS. 9A and 9B illustrate a concept of generating a second layout using a method of manufacturing a semiconductor device according to an example embodiment of the present disclosure.

In FIG. 9A, an x-axis is time (hr), and a y-axis is a first statistical index ($H^2$). In FIG. 9B, an x-axis is time (hr), and a y-axis is a second statistical index SPE. For example, the first statistical index and the second statistical index may be calculated by the following Equation.

$$H^2 = h^T h = (s_f(Wx+b))^T s_f(Wx+b)$$ [Equation 1]

$$SPE = e^T e = (x - g(f(x)))^T (x - g(f(x)))$$ [Equation 2]

In this case, the first statistical index represents a result of regression analysis with respect to the second layout, and the second statistical index represents a result of regression analysis with respect to the change (deviation) between the first layout and the newly generated second layout.

Referring to FIGS. 9A and 9B, when it is determined that the first statistical index and the second statistical index are a group (Group A) that exists outside the desired (or alternatively, preset) criteria, the processor 110 may determine that the coverage of the computing device 100 is insufficient, and may add the first statistical index and the second statistical index in the data set. For example, when the first statistical index and the second statistical index exist outside the desired (or alternatively, preset) criteria, the processor 110 may recognize the pattern corresponding to the first statistical index and the second statistical index as new pattern and may add the semiconductor patterns of the corresponding group in the second layout data to be the basis for generation of the data set.

Figure 10:
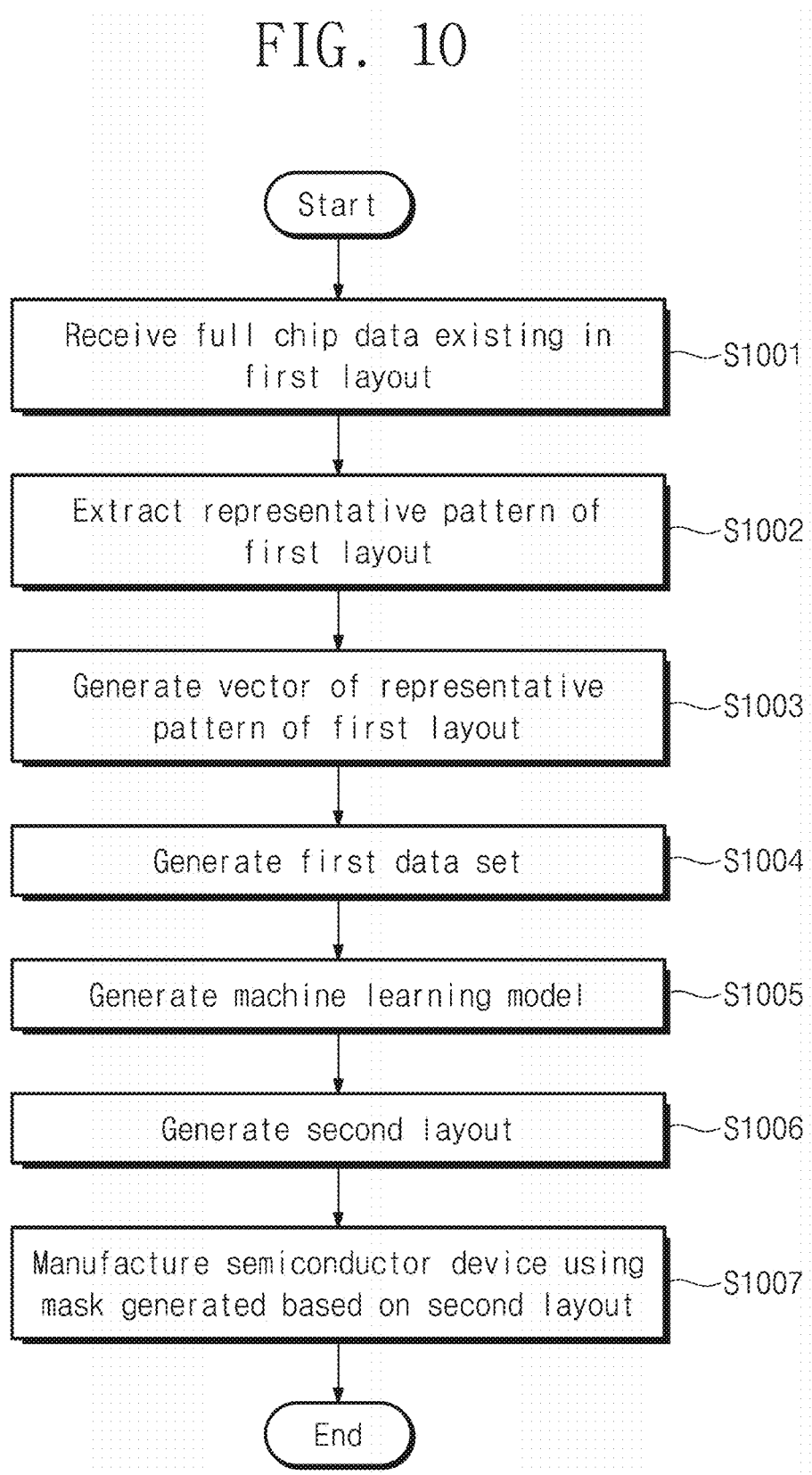
FIG. 10 is a flowchart illustrating a process of generating a second layout in a method of manufacturing a semiconductor device according to an example embodiment the present disclosure.

FIG. 10 is a flowchart illustrating a process of generating a second layout in a method of manufacturing a semiconductor device according to an example embodiment of the present disclosure.

Referring to FIG. 10, the pattern extractor 111 receives full chip data existing in the first layout (S1001), and the full chip data includes information associated with the unique pattern of the first layout.

When the full chip data are received, the pattern extractor 111 extracts the representative pattern of the first layout (S1002). For example, the representative pattern of the first layout may be an average value of total data associated with the first layout, but is not limited thereto.

When the representative pattern of the first layout is extracted, the data processor 112 generates a vector of the representative pattern of the first layout (S1003). For example, vectors associated with the representative pattern of the first layout may be generated by the k-means clustering algorithm and an auto encoding method.

When a vector of the representative pattern of the first layout is generated, the data processor 112 generates a first data set (S1004). The first data set is a set of data that is the basis for generation of the machine learning model. The first data set may include unique pattern information of the first layout and information about a difference between the unique pattern of the first layout and the unique pattern of the second layout.

When the first data set is generated, the data processor 112 generates the machine learning model by using the first data set (S1005). The machine learning model may be updated by repeating the above-described process. For example, the machine learning model may include information on the first data set, and may include information of the unique pattern of the first layout and information about a difference between the unique pattern of the first layout and the unique pattern of the second layout.

When the machine learning model is generated, the data extractor 113 generates the second layout (S1006). For example, the data extractor 113 may perform the optical proximity correction (OPC) with respect to the unique patterns of the first layout using the machine learning model, and may generate the second layout based on a result of the optical proximity correction.

When the second layout is generated, the computing device 100 may generate a mask based on the second layout and manufacture a semiconductor device using the mask (S1007).

Figure 11:
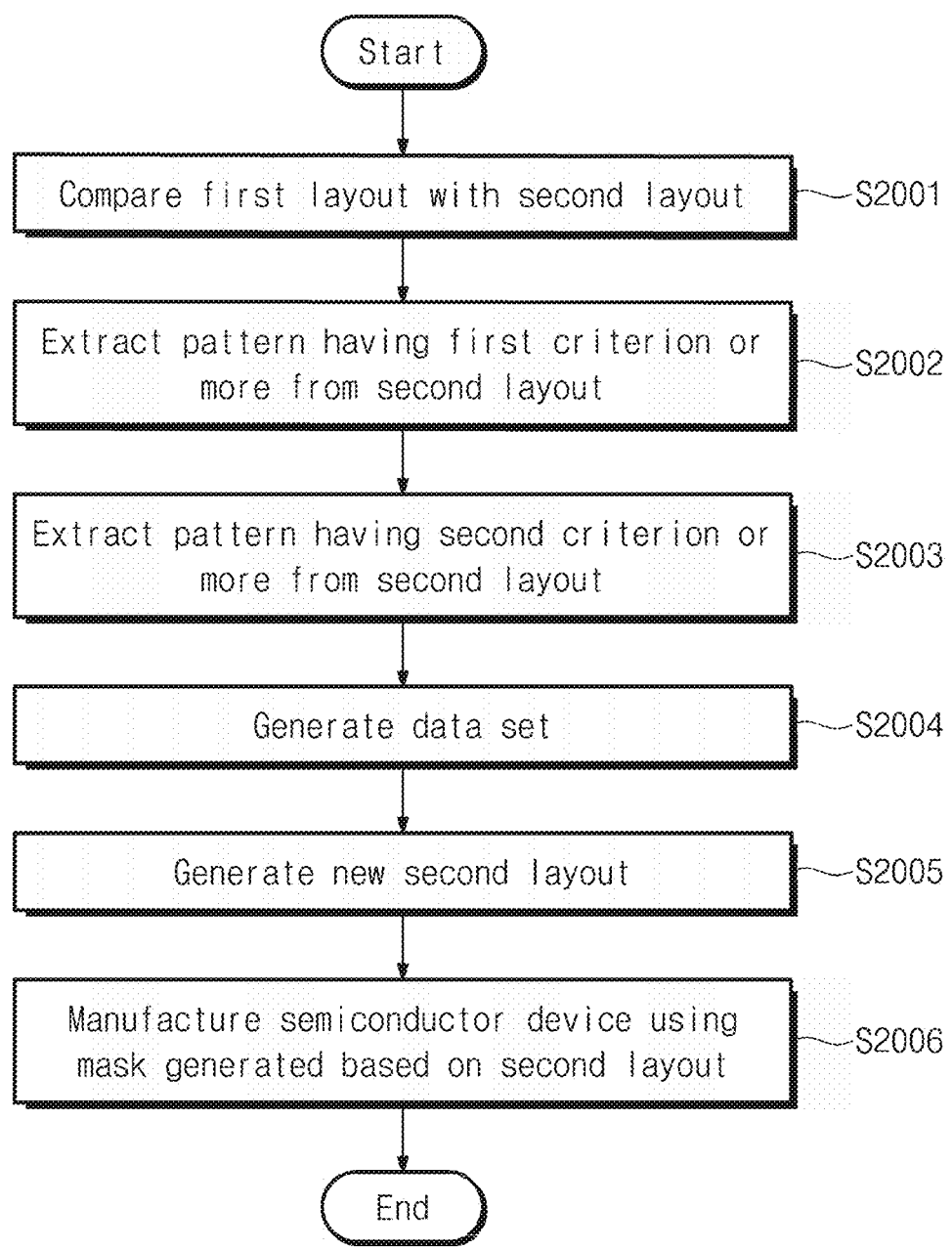
FIG. 11 is a flowchart illustrating a process of generating a new data set using a second layout in a method of manufacturing a semiconductor device according to an example embodiment the present disclosure.

FIG. 11 is a flowchart illustrating a process of generating a new data set using a second layout in a method of manufacturing a semiconductor device according to an example embodiment of the present disclosure.

The pattern extractor 111 compares the first layout with the second layout (S2001). For example, the pattern extractor 111 may compare the unique pattern of the first layout with the unique pattern of the second layout, and may extract a difference between the unique patterns.

When the comparison of the second layout and the first layout is completed, the data extractor 113 extracts a pattern that is greater than or equal to the first criterion from the second layout (S2002). For example, the first criterion relates to the arrangement error rate of the first layout. For example, the first criterion according to an example embodiment of the present disclosure may be a criterion for determining whether the arrangement error rate of the first layout is 10% or more. When the first criterion according to an example embodiment of the present disclosure is a criterion for determining whether the arrangement error rate of the first layout is 10% or more, the data processor 112 may extract the unique pattern of the semiconductor and may determine the extracted unique pattern as data to be the basis for generation of the second layout, when the arrangement error rate of the first layout is 10% or more.

When the extraction of the pattern having an arrangement error rate equal to the first criterion or more is completed with regard to the second layout, the data extractor 113 extracts the pattern having the second criterion or more in the second layout (S2003). For example, the second criterion relates to the upper management limit and the lower management limit of the first statistical data. For example, in the second criterion according to an example embodiment of the present disclosure, the upper management limit and the lower management limit of the first statistical data may be set to 95%. The second criterion according to an example embodiment of the present disclosure is when the upper management limit and the lower management limit of the first statistical data are set to 95%, the data extractor 113 may extract the unique pattern of the semiconductor at a point where the upper management limit and the lower management limit of a distribution of the first statistical data are 95% or more, and may determine the extracted unique pattern as data to be the basis for generation of the second layout.

When the unique patterns of the second layout are extracted depending on the first criterion and the second criterion, the data processor 112 generates a new data set (S2004).

When the new data set is generated, the data extractor 113 generates a new second layout (S2005).

Further, the computing device 100 according to an example embodiment of the present disclosure may manufacture a mask based on the generated second layout and manufacture a semiconductor device using the mask (S2006).

According to an example embodiment of the present disclosure, machine learning-based inference is performed based on characteristics of patterns, and a layout is generated as a result of or based on the inference. During the inference process, statistical data of unique patterns of a semiconductor may be reflected. Accordingly, methods and/or computing devices of generating a layout for manufacturing a semiconductor device having improved reliability and reduced computational amount may be provided.

While the present disclosure has been described with reference to some example embodiments thereof, it will be apparent to those of ordinary skill in the art that various changes and modifications may be made thereto without departing from the spirit and scope of the present disclosure as set forth in the following claims.

What is claimed is:

1. A non-transitory computer-readable medium storing codes that, when executed by a processor, cause the processor to perform operations of:
receiving full chip data including specific patterns of a first layout;
extracting a representative pattern of the first layout from the full chip data;
generating a vector of the extracted representative pattern;
generating a first data set based on the generated vector;
generating a machine learning model by performing machine learning with respect to the first data set;
executing an optical proximity correction (OPC) with respect to the specific patterns of the first layout by using the machine learning model;
generating a second layout based on a result of executing the OPC; and
causing to generate a mask for manufacturing a semiconductor device based on the second layout.

2. The non-transitory computer-readable medium of claim 1, wherein the generating a machine learning model includes:
performing a quantitative analysis on a difference between the specific patterns of the first layout and the specific patterns of the second layout;
generating a statistical data set based on a result of the quantitative analysis; and
generating first statistical data based on the statistical data set and the specific patterns of the second layout.

3. The non-transitory computer-readable medium of claim 1, wherein the generating a machine learning model includes:
extracting the specific patterns of the first layout by a pattern-based OPC accelerator included in the processor.

4. The non-transitory computer-readable medium of claim 1, wherein the generating a second layout includes:
determining an arrangement error rate of the first layout based on a first criterion; and
performing the OPC with respect to the specific patterns of the first layout based on a result of the determining an arrangement error rate.

5. The non-transitory computer-readable medium of claim 4, wherein the generating a second layout includes:
determining an upper management limit and a lower management limit of first statistical data based on a second criterion, the first statistical data generated during the generating a machine learning model; and performing the OPC with respect to the specific patterns of the first layout, based on a result of the determining an upper management limit and a lower management limit.

6. The non-transitory computer-readable medium of claim 4, wherein the first criterion is a criterion for determining whether the arrangement error rate of the first layout is 10% or more, and the generating a second layout includes extracting the specific patterns of the first layout when the arrangement error rate of the first layout is 10% or more.

7. The non-transitory computer-readable medium of claim 5, wherein the second criterion is a criterion for setting the upper management limit and the lower management limit of the first statistical data to 95%, and the generating a second layout includes extracting the specific patterns of the first layout at a point where the upper management limit and the lower management limit of a distribution of the first statistical data are 95% or more.

8. The non-transitory computer-readable medium of claim 2, wherein the generating a machine learning model includes:

adding the specific patterns of the first layout that are extracted at a point where an arrangement error rate of the first layout is 10% or more and an upper management limit and a lower management limit of a distribution of the first statistical data are 95% or more, to the first data set.

9. The non-transitory computer-readable medium of claim 1, wherein the codes, when executed by the processor, cause the processor to further perform operations of:

iterating the generating a machine learning model and the generating a second layout; and adding the specific patterns extracted from the second layout in the first data set.

10. A method of manufacturing a semiconductor device, the method comprising:

receiving, by at least one processor, full chip data including specific patterns of a first layout;

extracting, by the at least one processor, a representative pattern of the first layout from the full chip data;

generating, by the at least one processor, a vector of the extracted representative pattern;

generating, by the at least one processor, a first data set based on the generated vector;

generating, by the at least one processor, a machine learning model by performing machine learning with respect to the first data set;

executing, by the at least one processor, an optical proximity correction (OPC) with respect to the specific patterns of the first layout by using the machine learning model;

generating, by the at least one processor, a second layout based on a result of executing the OPC;

causing, by the at least one processor, to generate a mask; and causing, by the at least one processor, to manudfacture the semiconductor device based on the mask.

11. The method of claim 10, wherein the generating a machine learning model includes:

performing a quantitative analysis on a difference between the specific patterns of the first layout and the specific patterns of the second layout;

generating a statistical data set based on a result of the quantitative analysis; and generating first statistical data based on the statistical data set and the specific patterns of the second layout.

12. The method of claim 10, wherein the generating a machine learning model includes:

extracting the specific patterns of the first layout by a pattern-based OPC accelerator included in the at least one processor.

13. The method of claim 10, wherein the generating a second layout includes:

determining an arrangement error rate of the first layout based on a first criterion; and performing the OPC with respect to the specific patterns of the first layout based on a result of the determining an arrangement error rate.

14. The method of claim 13, wherein the generating a second layout includes:

determining an upper management limit and a lower management limit of first statistical data based on a second criterion, the first statistical data generated during the generating a machine learning model; and performing the OPC with respect to the specific patterns of the first layout, based on a result of the determining an upper management limit and a lower management limit.

15. The method of claim 13, wherein the first criterion is a criterion for determining whether the arrangement error rate of the first layout is 10% or more, and the generating a second layout includes extracting the specific patterns of the first layout when the arrangement error rate of the first layout is 10% or more.

16. The method of claim 14, wherein the second criterion is a criterion for setting the upper management limit and the lower management limit of the first statistical data to 95%, and the generating a second layout includes extracting the specific patterns of the first layout at a point where the upper management limit and the lower management limit of a distribution of the first statistical data are 95% or more.

17. The method of claim 11, wherein the generating a machine learning model includes:

adding the specific patterns of the first layout that are extracted at a point where an arrangement error rate of the first layout 10% or more and an upper management limit and a lower management limit of a distribution of the first statistical data are 95% or more, to the first data set.

18. The method of claim 10, further comprising:

iterating the generating a machine learning model and the generating a second layout; and adding the specific patterns extracted from the second layout in the first data set.

19. A computing device for manufacturing a mask for manufacturing a semiconductor device, the computing device comprising:

at least one processor configured to, receive full chip data including specific patterns of a first layout, extract representative pattern of the first layout from the full chip data, generate a vector of the extracted representative pattern, generate a first data set based on the generated vector,
generate a machine learning model by performing machine learning with respect to the first data set,
execute an optical proximity correction (OPC) with respect to the specific patterns of the first layout by using the machine learning model,
generate a second layout based on a result of executing the OPC, and
cause to generate the mask based on the second layout.

* * * * *